US008482292B2

(12) United States Patent
Tsubota

(10) Patent No.: US 8,482,292 B2
(45) Date of Patent: Jul. 9, 2013

(54) STATUS DETECTING DEVICE AND STORAGE MEDIUM STORING PROGRAM

(75) Inventor: Hirokazu Tsubota, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 289 days.

(21) Appl. No.: 12/861,167

(22) Filed: Aug. 23, 2010

(65) Prior Publication Data

US 2011/0187383 A1 Aug. 4, 2011

(30) Foreign Application Priority Data

Feb. 2, 2010 (JP) ................................. 2010-021615

(51) Int. Cl.
*G01R 31/04* (2006.01)

(52) U.S. Cl.
USPC ........................................................ 324/538

(58) Field of Classification Search
USPC ........................................................ 324/538
See application file for complete search history.

(56) References Cited

U.S. PATENT DOCUMENTS

| | | | | |
|---|---|---|---|---|
| 3,711,767 A * | 1/1973 | Campbell et al. | ............... | 324/538 |
| 3,803,484 A * | 4/1974 | Gray | ............................. | 324/544 |
| 4,647,844 A * | 3/1987 | Biegon et al. | ................. | 324/627 |
| 5,436,554 A * | 7/1995 | Decker, Jr. | ...................... | 324/66 |
| 5,436,555 A * | 7/1995 | Locke et al. | ..................... | 324/66 |
| 5,570,029 A * | 10/1996 | Bottman et al. | ............... | 324/628 |
| 5,629,628 A * | 5/1997 | Hinds et al. | ................... | 324/628 |
| 5,886,531 A * | 3/1999 | Delcourt et al. | ............... | 324/627 |
| 5,990,687 A * | 11/1999 | Williams | ........................ | 324/529 |
| 6,118,281 A * | 9/2000 | Walter | ............................ | 324/627 |
| 6,281,685 B1 * | 8/2001 | Tuttle | ............................. | 324/529 |
| 6,466,885 B2 * | 10/2002 | Miller, Jr. | ...................... | 702/116 |
| 6,937,029 B2 * | 8/2005 | Gambardella et al. | ......... | 324/627 |
| 7,193,422 B2 * | 3/2007 | Velleca et al. | ................. | 324/538 |
| 7,358,745 B1 * | 4/2008 | Lo et al. | ......................... | 324/533 |
| 7,548,070 B2 * | 6/2009 | Forster et al. | .................. | 324/543 |
| 7,915,898 B1 * | 3/2011 | Kraemer | ........................ | 324/527 |
| 7,999,556 B2 * | 8/2011 | Buer | .............................. | 324/512 |
| 2002/0171433 A1 * | 11/2002 | Watanabe et al. | ............. | 324/539 |
| 2005/0083067 A1 * | 4/2005 | Kirbas | ........................... | 324/539 |
| 2005/0104734 A1 * | 5/2005 | Graube | ........................... | 340/650 |
| 2005/0264299 A1 * | 12/2005 | Manani et al. | ................. | 324/539 |

FOREIGN PATENT DOCUMENTS

| | | |
|---|---|---|
| JP | A-10-115655 | 5/1998 |
| JP | A-2001-338725 | 12/2001 |
| JP | A-2003-242457 | 8/2003 |

* cited by examiner

*Primary Examiner* — Patrick Assouad
*Assistant Examiner* — Demetrius Pretlow
(74) *Attorney, Agent, or Firm* — Oliff & Berridge, PLC

(57) ABSTRACT

A status detecting device that includes a first contact member, a second contact member, an applying component, a grounding component, a detecting component, and an executing component is provided. The applying component applies a predetermined voltage to the first contact member. The grounding component grounds the second contact member. The detecting component detects at least one of a potential between the applying component and the first contact member, or a potential between the second contact member and the grounding component. The executing component executes predetermined processing, based on a detection result from the detecting component.

8 Claims, 13 Drawing Sheets

STATUS DETECTING DEVICE AND STORAGE MEDIUM STORING PROGRAM

CROSS-REFERENCE TO RELATED APPLICATION

This application is based on and claims priority under 35 USC 119 from Japanese Patent Application No. 2010-021615 filed Feb. 2, 2010.

BACKGROUND

1. Technical Field of the Invention

The invention relates to a status detecting device and program.

2. Related Art

There have been a system for detecting cable misconnection, a method for detecting chattering of a memory card at the time of connection insertion, and a connecting device that determines whether the signal pin of a first connector is inserted in the signal pin insertion slot of a second connector.

SUMMARY

According to an aspect of the present invention, a status detecting device is provided. The status detecting device includes: a first contact member that is provided in a connection portion to which a connecting portion of a communication wire having the connecting portion at an end portion thereof is to be connected, the first contact member being brought into contact with a shielding member of the communication wire when the connecting portion is connected to the connection portion; a second contact member that is provided in the connection portion and is not connected to the first contact member, the second contact member being brought into contact with the shielding member when the connecting portion is connected to the connection portion; an applying component that applies a predetermined voltage to the first contact member; a grounding component that grounds the second contact member; a detecting component that detects at least one of a potential between the applying component and the first contact member, or a potential between the second contact member and the grounding component; and an executing component that executes predetermined processing, based on a detection result from the detecting component.

BRIEF DESCRIPTION OF THE DRAWINGS

Exemplary embodiments of the present invention will be described in detail based on the following figures, wherein.

DETAILED DESCRIPTION

The following is a description of exemplary embodiments of the invention, with reference to the accompanying drawings. In each of the exemplary embodiments, the invention is applied to an image forming system that includes a control device that transmits image information indicating an image to be formed and control information as to the image formation, and an image forming apparatus that receives the image information and the control information, and forms the image.

First Exemplary Embodiment

Figure 1:
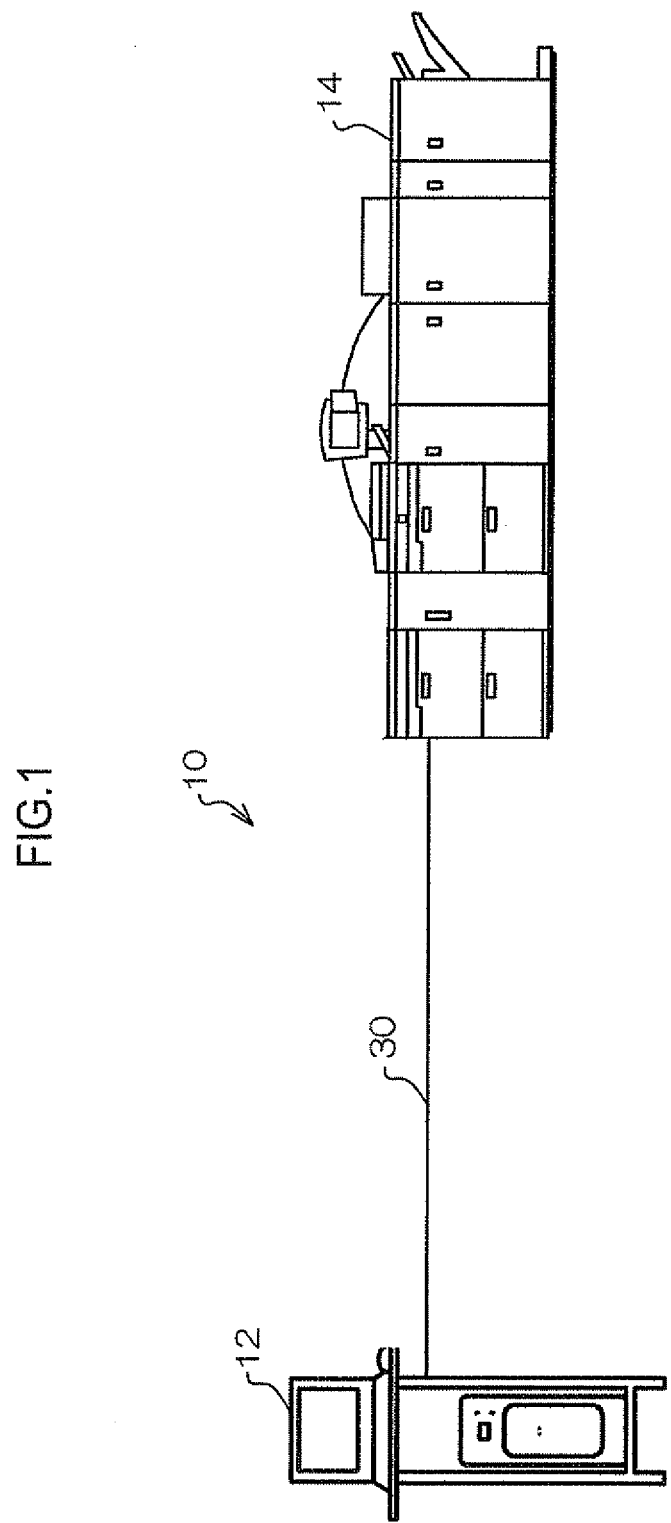
FIG. 1 is a side view showing an example of an overall structure of an image forming system according to exemplary embodiments.

First, referring to FIG. 1, the overall structure of an image forming system 10 according to this exemplary embodiment is described.

As shown in the drawing, the image forming system 10 according to this exemplary embodiment includes a control device 12 that transmits the image information and the control information, and an image forming apparatus 14 that performs an image forming operation based on the information transmitted from the control device 12.

In the image forming system 10 according to this exemplary embodiment, the control device 12 and the image forming apparatus 14 are connected to each other by a communication cable 30 that serves as a transmission path for various kinds of information.

Figure 2:
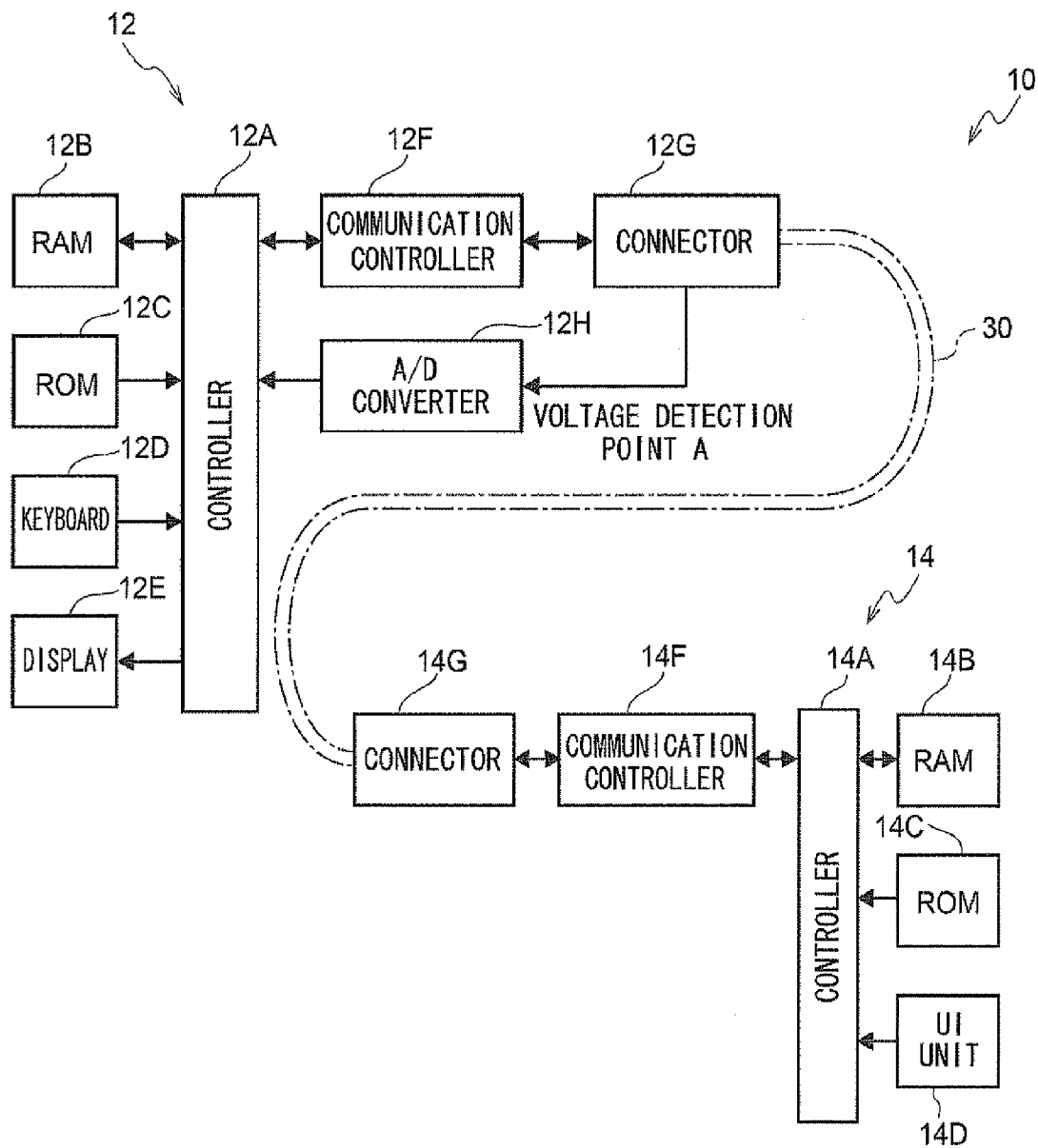
FIG. 2 is a block diagram showing an example of the essential structure of the electric system of each image forming system according to the first, second, and fourth exemplary embodiments.

Referring now to FIG. 2, the electrical principal components of the image forming system 10 according to this exemplary embodiment are described.

As shown in the drawing, the control device 12 according to this exemplary embodiment includes a controller 12A that controls the overall operation of the control device 12.

A RAM (Random Access Memory) 12B and a ROM (Read Only Memory) 12C are connected to the controller 12A, and the RAM 12B and the ROM 12C are accessed by the controller 12A.

A keyboard 12D and a display 12E are connected to the controller 12A, and the controller 12A acquires various kinds of information received through the keyboard 12D, and causes the display 12E to display the various kinds of information.

The control device 12 includes a connector 12G that is electrically connected to the image forming apparatus 14 by the communication cable 30 that is compliant with predetermined communication standards.

In the image forming system 10 according to this exemplary embodiment, the Ethernet (a registered trade name) is used as the communication standards, and a LAN (Local Area Network) cable for the Ethernet (a registered trade name) is used as the communication cable for the connection to the image forming apparatus 14.

There are a number of specifications for such communication cables, and the specifications are classified into different categories such as Category 5, Category 5e, Category 6, Category 6e, and Category 7. However, the specifications of the plugs for those communication cables are uniform. Accordingly, any LAN cables for the Ethernet (a registered trade name) can be connected to the same connector.

The control device 12 includes a communication controller 12F that controls communications compliant with the above described communication standards. The connector 12G is connected to the controller 12A via the communication controller 12F. With this arrangement, the controller 12A exchanges various kinds of information with the image forming apparatus 14 via the communication cable 30, the connector 12G, and the communication controller 12F.

Meanwhile, the image forming apparatus 14 according to this exemplary embodiment includes a controller 14A that controls the overall operation of the image forming apparatus 14.

A RAM 14B and a ROM 14C are connected to the controller 14A, and the RAM 1413 and the ROM 14C are accessed by the controller 14A.

A UI (User Interface) unit 14D including a receiving unit and a display unit is also connected to the controller 14A, and the controller 14A acquires various kinds of information received via the receiving unit of the UI unit 14D, and causes the display unit of the UI unit 14D to display the various kinds of information. In the image forming apparatus 14 according to this exemplary embodiment, a display having a transmission-type touch panel that functions as the receiving unit is used as the UI unit 14D. However, the UI unit 14D is not limited to such a touch panel, and other structures that has the display unit and the receiving unit formed independently of each other may be used, for example.

The image forming apparatus 14 further includes a connector 14G for electrically connecting to the control device 12 with the communication cable 30, and a communication controller 14F that controls communications compliant with the above described communication standards. The connector 14G is connected to the controller 14A via the communication controller 14F. With this arrangement, the controller 14A exchanges various kinds of information with the control device 12 via the communication cable 30, the connector 14G, and the communication controller 14F.

Although the image forming apparatus 14 further includes a number of components for performing image forming operations as well as the above described components, explanation of them is omitted herein to avoid complication.

In the image forming system 10 according to this exemplary embodiment, a LAN cable having a shielding member provided for the communication wire is required as the communication cable 30, to prevent occurrences of troubles in communication operations between the control device 12 and the image forming apparatus 14 by reducing the influence of electromagnetic noise from the outside and reducing self-emitting radiation noise. A LAN cable of Category 7 may be used as this kind of communication cable, for example.

Since a LAN cable having the above described shielding member is used in the image forming system 10 according to this exemplary embodiment, a measure against noise is provided in each relevant component so that communication operations can be performed between the control device 12 and the image forming apparatus 14 without any trouble.

Figure 3:
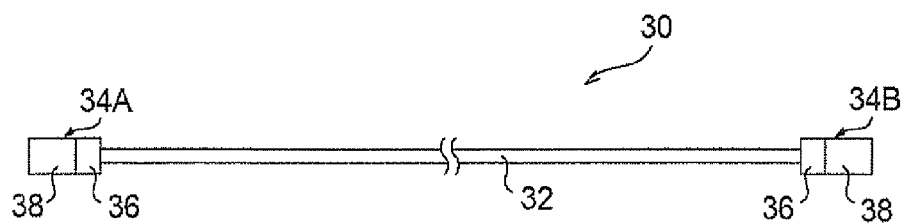
FIG. 3 is a plan view showing an example structure of a communication cable according to the exemplary embodiments.

FIG. 3 shows the structure of the communication cable 30 according to this exemplary embodiment.

As shown in the drawing, the communication cable 30 according to this exemplary embodiment has a cable main body 32. A plug 34A is provided at one end portion of the cable main body 32, and a plug 34B is provided at the other end portion of the cable main body 32.

In each of the plug 34A and the plug 34B, the outer circumferential portions on the side of the cable main body 32 are formed with insulators 36, and the outer circumferential portions on the top end sides are covered with metal members 38 that have conductive properties and are electrically connected to the shielding member.

As described above, since a LAN cable for the Ethernet (a registered trade name) is required as the communication cable 30 in the image forming system 10 according to this exemplary embodiment, a LAN cable of another category may be used. If a communication cable of a category such as Category 6 that does not have a shielding member is used, proper communication operations cannot be guaranteed.

Therefore, the image forming system 10 according to this exemplary embodiment has a status detecting function to detect the state of the shield of the communication cable used for the connection between the control device 12 and the image forming apparatus 14.

Figure 4:
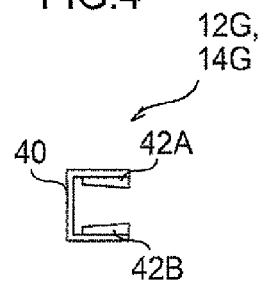
FIG. 4 is a plan view showing an example structure of a connector according to the exemplary embodiments.

FIG. 4 is a plan view of the connector 12G and the connector 14G according to this exemplary embodiment.

As shown in the drawing, the connector 12G and the connector 14G according to this exemplary embodiment each include a housing unit 40 having a plug of a communication cable inserted therein, and a pair of grounding members 42A and 42B for grounding a shielding member where the communication cable having the plug of the communication cable inserted into the housing unit 40 has the shielding member.

The grounding member 42A and the grounding member 42B are made of a metal with conductive properties. The grounding member 42A and the grounding member 42B are not in contact with each other, and are provided in the housing unit 40 independently of each other. When the plug 34A or the plug 34B of the communication cable 30 having a shield is inserted into the housing unit 40, the metal member 38 of the plug is brought into contact with the grounding member 42A and the grounding member 42B. Further, terminals for transmitting and receiving electrical signals transmitted through the communication cables 30 are provided in the housing unit 40.

Figure 5:
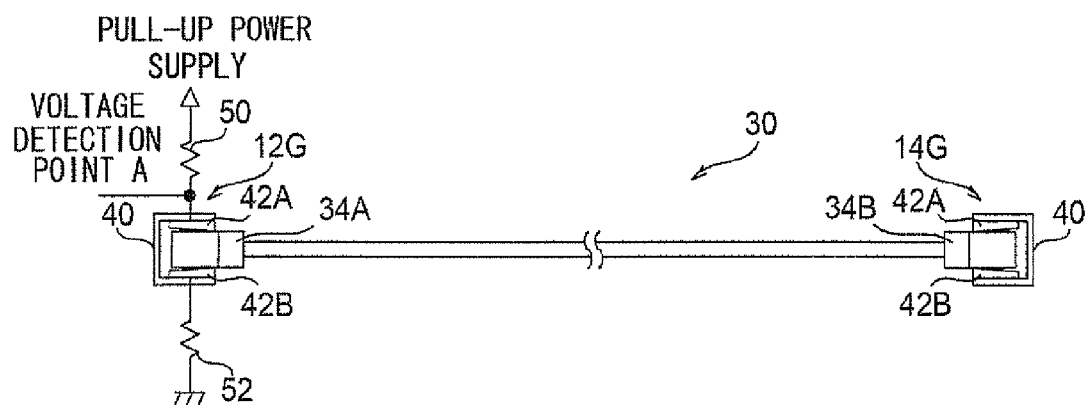
FIG. 5 is a plan view (partially a circuit diagram) showing example structures of the peripheral portions of the connectors according to the first exemplary embodiment.

FIG. 5 shows the structures of the peripheral portions of the connector 12G and the connector 14G to which the communication cable 30 is connected.

As shown in the drawing, the grounding member 42A of the connector 12G is "pulled up" to a predetermined voltage via a resistor 50, while the grounding member 42B of the connector 12O is grounded via a resistor 52. The connecting wire between the resistor 50 and the grounding member 42A is divided (the dividing point is referred to as the "voltage detection point A"), and is connected to the controller 12A via an A/D (analog-digital) converter 12H, as shown in FIG. 2. With this arrangement, the controller 12A acquires the voltage value at the voltage detection point A.

As described above, in the image forming system 10 according to this exemplary embodiment, a predetermined voltage is applied to the grounding member 42A of the two grounding members of the connector 12G, while the other grounding member 42B of the connector 12G is grounded. Therefore, where a communication cable having a shield is used, the voltage value at the voltage detection point A becomes equal to the value (hereinafter referred to as the "normal value") obtained by dividing the voltage value from the pull-up power supply by the resistor 50 and the resistor 52. Where a communication cable not having a shield is used, on the other hand, the voltage value at the voltage detection point A is maintained at a voltage value that is observed where a communication cable is not connected to the connectors 12G and 14G, and is at least higher than the normal value.

Therefore, in the image forming system 10 according to this exemplary embodiment, the above mentioned status detecting function is realized by determining whether the voltage value at the voltage detection point A falls within a range predetermined as an allowable range of the normal value, and then determining whether the communication cable used has a shield. The information indicating the allowable range (hereinafter referred to as the "allowable range information") is stored beforehand in the ROM 12C of the control device 12.

The various operations such as the operations to be performed by the image forming system 10 of the above structure to realize the status detecting function may be realized by a software structure executing a program and utilizing a computer. However, the operations are not limited to the realization by a software structure, and may be realized by a hardware structure or a combination of a hardware structure and a software structure.

In the following, a case in which the various operations are realized by the image forming system 10 of this exemplary embodiment executing the above program is described. In this case, the subject program may be installed beforehand in the control device 12 or the image forming apparatus 14, or may be stored in a computer-readable recording medium, or may be distributed via a wire or wireless communication component.

Figure 6:
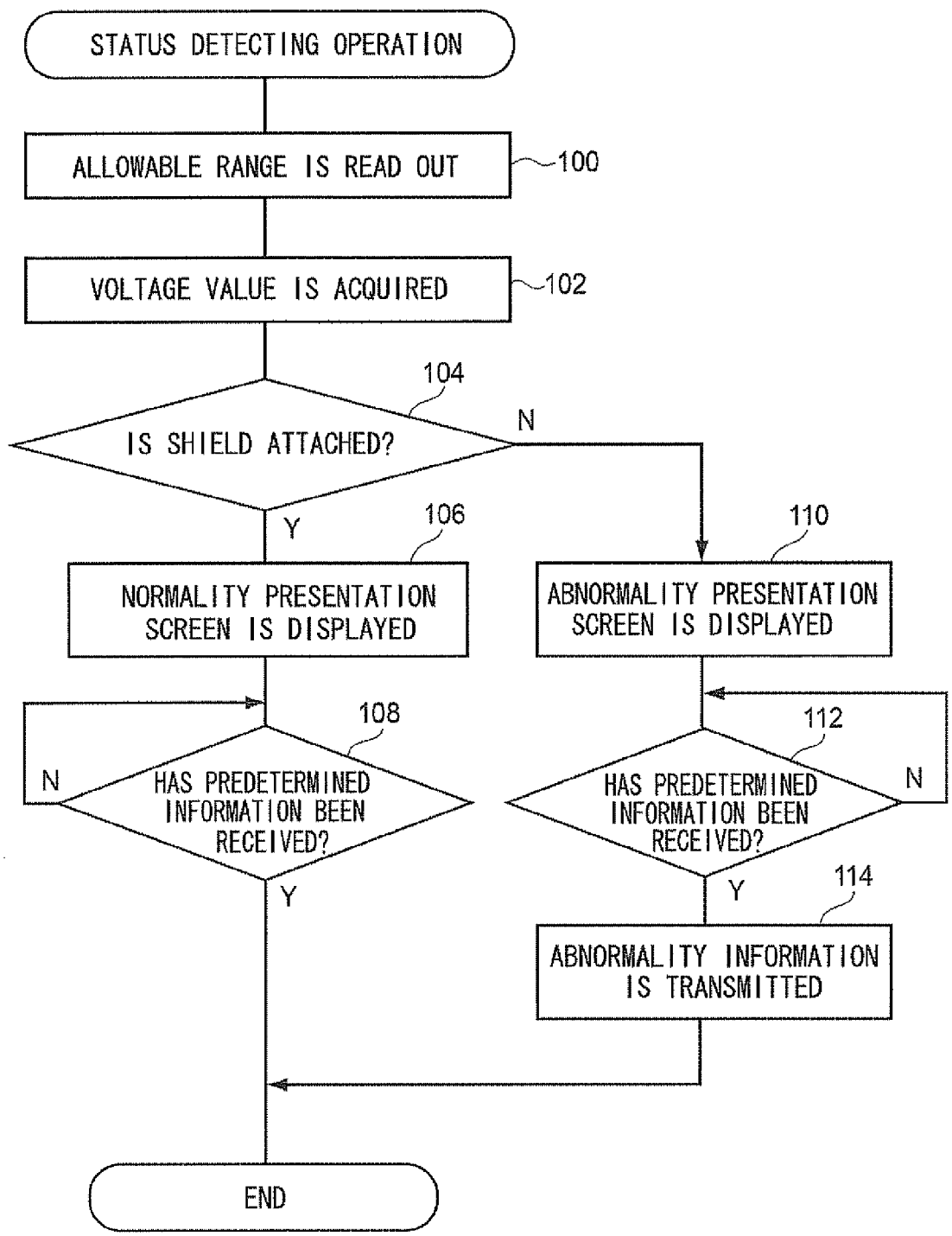
FIG. 6 is a flowchart showing an example of the operation flow in a status detecting operation program according to the first, second, and fourth embodiments.

Next, referring to FIG. 6, an operation to activate the status detecting function of the image forming system 10 according to this exemplary embodiment is described. FIG. 6 is a flowchart showing the operation flow according to a status detecting operation program to be executed by the controller 12A of the control device 12 when the instruction information for instructing the image forming system 10 to execute the status detecting function where the control device 12 and the image forming apparatus 14 are connected to each other by a communication cable is received from the user of the image forming system 10 via the keyboard 12D. This program is stored beforehand in the ROM 12C.

First, at step 100 of FIG. 6, the allowable range information is read from the ROM 12C. At step 102, the voltage value at the voltage detection point A is acquired via the A/D converter 12H.

At step 104, a check is made to determine whether the voltage value acquired in the procedure of step 102 falls within the allowable range indicated by the allowable range information read through the procedure of step 100, so as to determine whether the connected communication cable has a shield. If the checking result is positive, the operation moves on to step 106, and the display 12E is controlled to display a predetermined normality presentation screen. At step 108, predetermined information is awaited.

Figure 7:
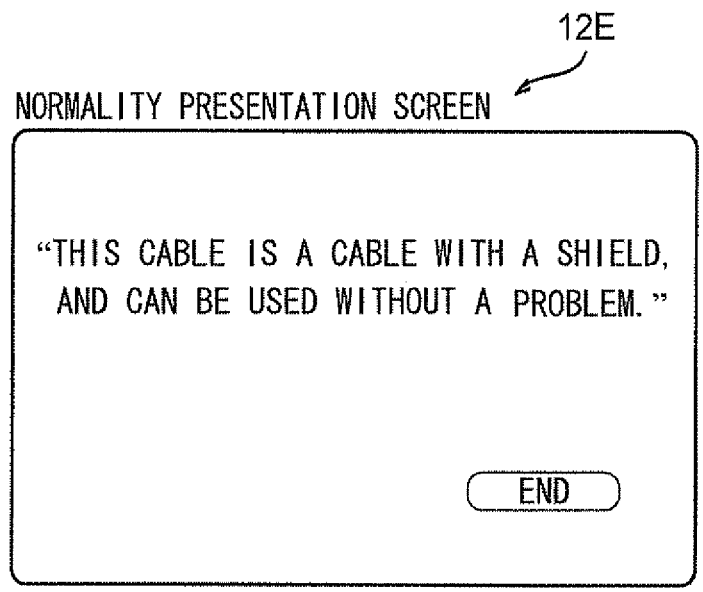
FIG. 7 is a front view showing an example displayed state of a normality presentation screen according to the exemplary embodiments.

FIG. 7 shows an example of a displayed state of the normality presentation screen according to this exemplary embodiment. As shown in the drawing, the information indicating that the connected communication cable is a cable with a shield (in the example shown in the drawing, the information message is "This cable is a cable with a shield, and can be used without a problem.") is displayed on the normality presentation screen according to this exemplary embodiment. After seeing the screen, the user of the image forming system 10 selects, via the keyboard 12D, the "END" button displayed on the lower portion of the screen. In this manner, the checking result of step 108 becomes positive, and this status detecting operation program comes to an end.

If the checking result of step 104 is negative, on the other hand, the connected communication cable is determined not to be a cable having a shield, and the operation moves on to step 110. After the display 12E is controlled to display a predetermined abnormality presentation screen, predetermined information is awaited at step 112.

Figure 8:
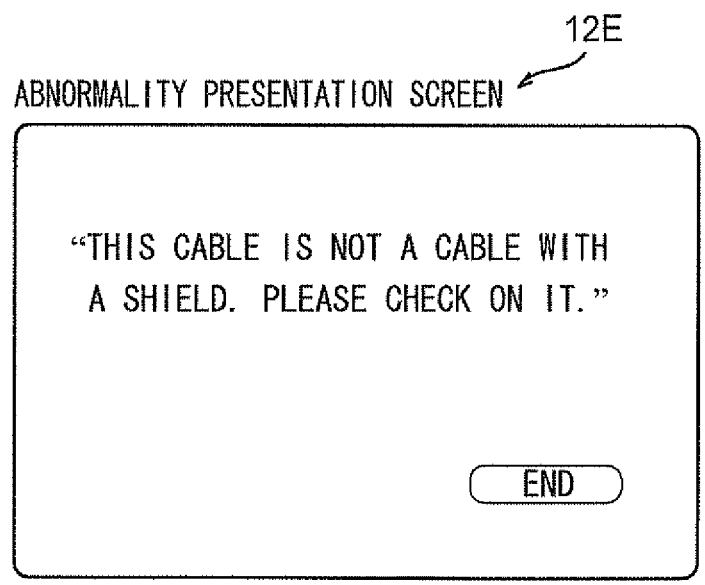
FIG. 8 is a front view showing an example displayed state of an abnormality presentation screen according to the first, second, and fourth exemplary embodiments.

FIG. 8 shows an example of a displayed state of the abnormality presentation screen according to this exemplary embodiment. As shown in the drawing, the information indicating that the connected communication cable is not a cable with a shield (in the example shown in the drawing, the information message is "This cable is not a cable with a shield. Please check on it.") is displayed on the abnormality presentation screen according to this exemplary embodiment. After seeing the screen, the user of the image forming system 10 selects, via the keyboard 12D, the "END" button displayed on the lower portion of the screen. In this manner, the checking result of step 112 becomes positive, and this operation moves on to step 114.

At step 114, the information indicating that the connected communication cable is not a cable with a shield (hereinafter referred to as the "abnormality information") is transmitted to the image forming apparatus 14 via the communication cable, and this status detecting operation program then comes to an end. When receiving the abnormality information, the image forming apparatus 14 associates the abnormality information with the information indicating the date and time at that point, and stores the information as history information into the RAM 14B. The image forming apparatus 14 also causes the display unit of the UI unit 14D to display the information indicating that the communication cable is not a cable with a shield.

As described above, in the image forming system 10 according to this exemplary embodiment, a voltage is applied to the grounding member 42A that should originally be grounded, so as to realize the status detecting function. Therefore, the value of the voltage should preferably be minimized within such a range as to determine whether the connected communication cable has a shield.

Figure 9:
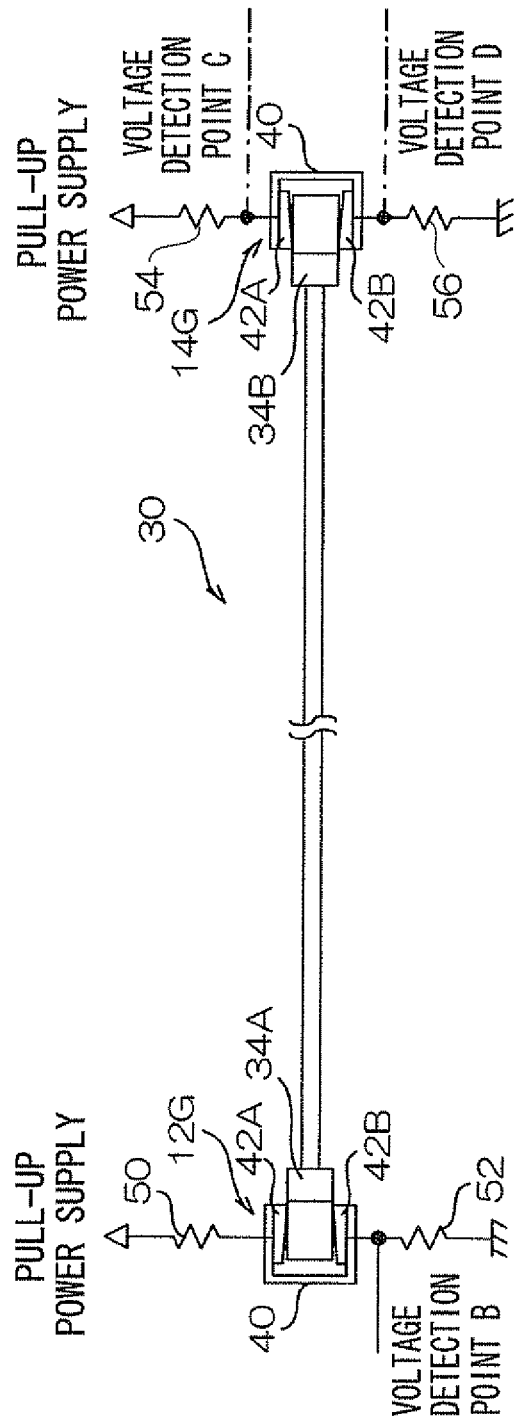
FIG. 9 is a plan view (partially a circuit diagram) showing a modification of the structures of the peripheral portions of the connectors according to the first exemplary embodiment.

In this exemplary embodiment, a point between the resistor 50 and the grounding member 42A is used as a voltage detection point. However, the invention is not limited to such arrangement. For example, a point between the grounding member 42B and the resistor 52 may be used as shown in FIG. 9. Alternatively, while the grounding member 42A of the connector 14G is pulled up to a predetermined voltage via a resistor 54, the grounding member 42B of the connector 14G may be grounded via a resistor 56, as in this exemplary embodiment. In this case, a voltage detection point C may be set between the resistor 54 and the grounding member 42A, or a voltage detection point D may be set between the grounding member 42B and the resistor 56.

Where the voltage detection point C or the voltage detection point D is set, the image forming apparatus 14 may execute the status detecting operation program, or the voltage value at the voltage detection point C or the voltage detection point D may be transmitted to the control device 12 via the communication cable 30 so that the control device 12 executes the status detecting operation program, for example.

In this exemplary embodiment, the two resistors 50 and 52 are used. However, the invention is not limited to such arrangement, and only one of the resistors 50 and 52 may be used, for example. Therefore, in the example illustrated in FIG. 9, only one of the resistors 54 and 56 may be used.

Second Exemplary Embodiment

Figure 10:
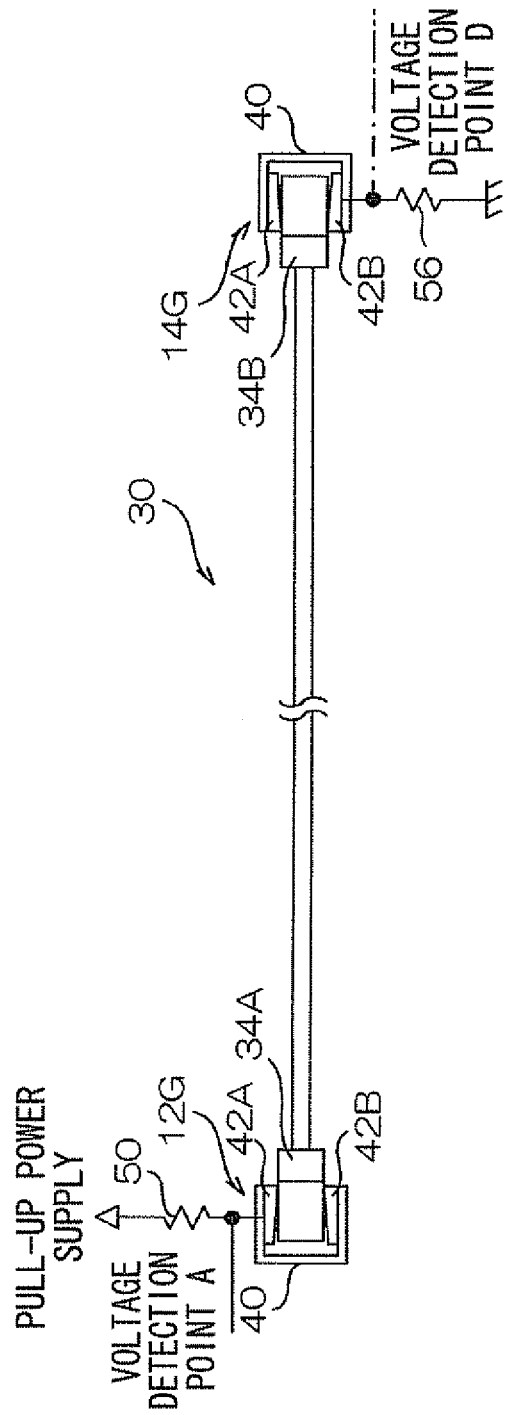
FIG. 10 is a plan view (partially a circuit diagram) showing example structures of the peripheral portions of connectors according to the second exemplary embodiment.

The overall structure of the image forming system 10 and the structures of the communication cable 30 and the connectors 12G and 14G according to a second exemplary embodiment are the same as those of the image forming system 10 according to the above described first exemplary embodiment (see FIGS. 1 through 4), and therefore, explanation of them is omitted herein. Referring now to FIG. 10, the structures of the peripheral portions of the connector 12G and the connector 14G according to the second exemplary embodiment are described.

As shown in the drawing, in the image forming system 10 according to this exemplary embodiment, the grounding member 42A of the connector 12G is pulled up to a predetermined voltage via the resistor 50, while a grounding member 42B of the connector 14G is grounded via the resistor 56. The connecting wire between the resistor 50 and the grounding member 42A of the connector 12G is divided, and the dividing point (a voltage detection point A) is connected to the controller 12A via the A/D converter 12H. With this arrangement, the controller 12A acquires the voltage value at the voltage detection point A.

As described above, in the image forming system 10 according to this exemplary embodiment, a predetermined voltage is applied to the grounding member 42A of the connector 12G of the two connectors, while the grounding member 42B of the other connector 14G is grounded. Therefore, where a communication cable having a shield is used, the voltage value at the voltage detection point A becomes equal to the value (hereinafter referred to as the "normal value") obtained by dividing the voltage value from the pull-up power supply by the resistor 50 and the resistor 56. Where a communication cable not having a shield is used, on the other hand, the voltage value at the voltage detection point A is maintained at a voltage value that is observed where a communication cable is not connected to the connectors 12G and 14G, and is higher than the normal value.

Therefore, in the image forming system 10 according to this exemplary embodiment, the above mentioned status detecting function is realized by determining whether the voltage value at the voltage detection point A falls within a range predetermined as an allowable range of the normal value, and then determining whether the communication cable used has a shield. The information indicating the allowable range (hereinafter referred to as the "allowable range information") is stored beforehand in the ROM 12C of the control device 12.

Figure 11:
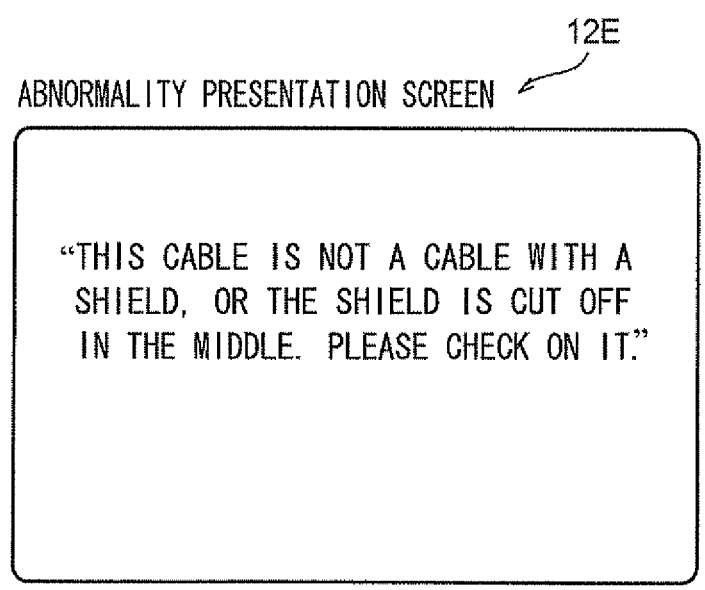
FIG. 11 is a front view showing an example displayed state of an abnormality presentation screen according to the second exemplary embodiment.

Since the operation to activate the status detecting function of the image forming system 10 according to this exemplary embodiment is substantially the same as the operation to activate the status detecting function of the image forming system 10 according to the first exemplary embodiment, explanation of the operation is omitted herein. However, the only difference from the first exemplary embodiment is that the abnormality presentation screen displayed through the procedure of step 110 in the status detecting operation program (see FIG. 6) displays the information indicating that the connected communication cable is not a cable with a shield, or the shield is cut off in the middle (in the example illustrated in the drawing, the information message is "This cable is not a cable with a shield, or the shield is cut off in the middle. Please check on it."), as shown as an example in FIG. 11.

Figure 12A:
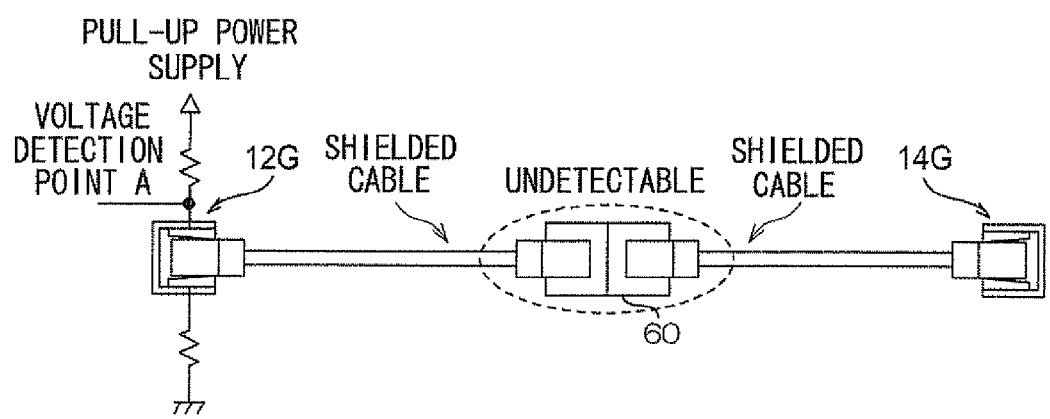
FIGS. 12A and 12B are plan views (partially circuit diagrams) for explaining the problems in the first exemplary embodiment.
Figure 12B:
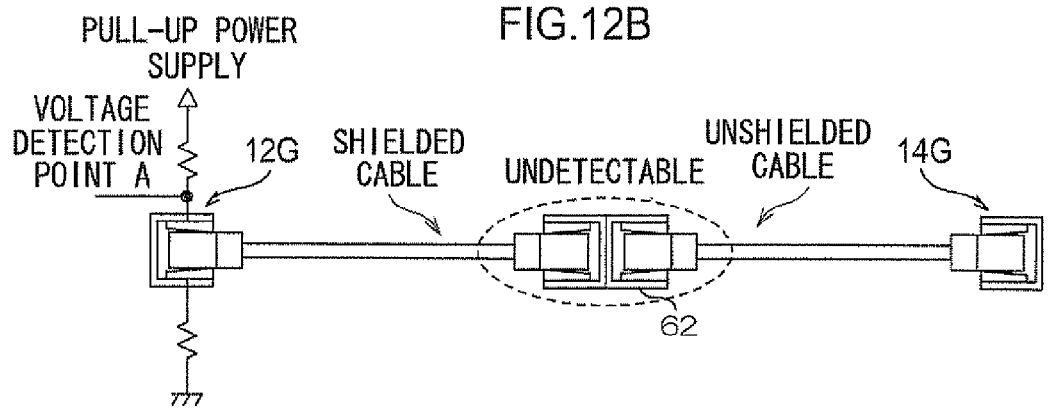

The status detecting function according to the first exemplary embodiment cannot detect the state of a shield, if two or more communication cables (two in the example illustrated in FIG. 12A) with shields are connected to each other by a relay device 60 not having grounding members for grounding shielding members as shown as an example in FIG. 12A, or if two or more communication cables (two in the example illustrated in FIG. 12B) connected to each other by a relay device 62 having the grounding members include a communication cable not having a shield as shown as an example in FIG. 12B.

On the other hand, the image forming system 10 according to the second exemplary embodiment has the structure shown as an example in FIG. 10, and accordingly, a case where the shield is cut off in the middle as in FIGS. 12A and 12B can be detected, for example.

Although a point between the resistor 50 and the grounding member 42A of the connector 12G is used as a voltage detection point in this exemplary embodiment, the invention is not limited to such arrangement. For example, the voltage detection point D indicated by a dot-and-dash line between the grounding member 42B of the connector 14G and the resistor 56 in FIG. 10 may be used.

As an example in which the voltage detection point D is used, the status detecting operation program may be executed by the image forming apparatus 14, or the voltage value at the voltage detection point D is transmitted to the control device 12 via the communication cable 30 so that the status detecting operation program is executed by the control device 12.

In this exemplary embodiment, the two resistors 50 and 56 are used. However, the invention is not limited to such arrangement, and only one of the resistors 50 and 56 may be used, for example.

Third Exemplary Embodiment

Figure 13:
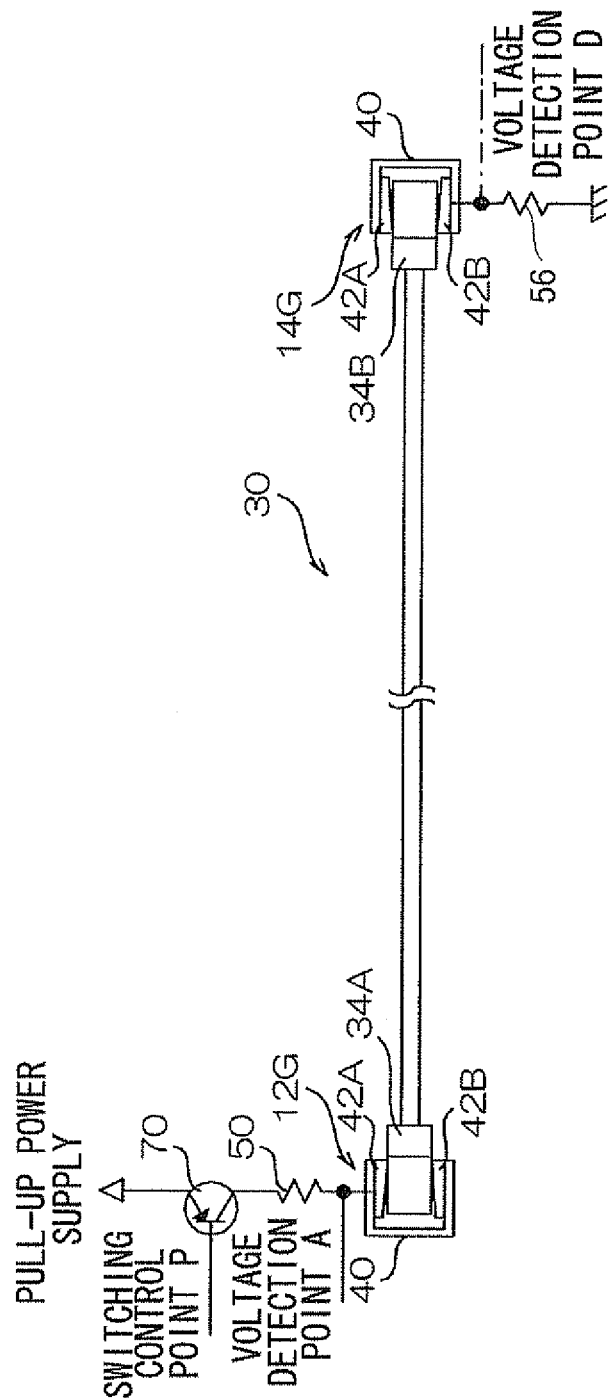
FIG. 13 is a plan view (partially a circuit diagram) showing example structures of the peripheral portions of connectors according to a third exemplary embodiment.
Figure 14:
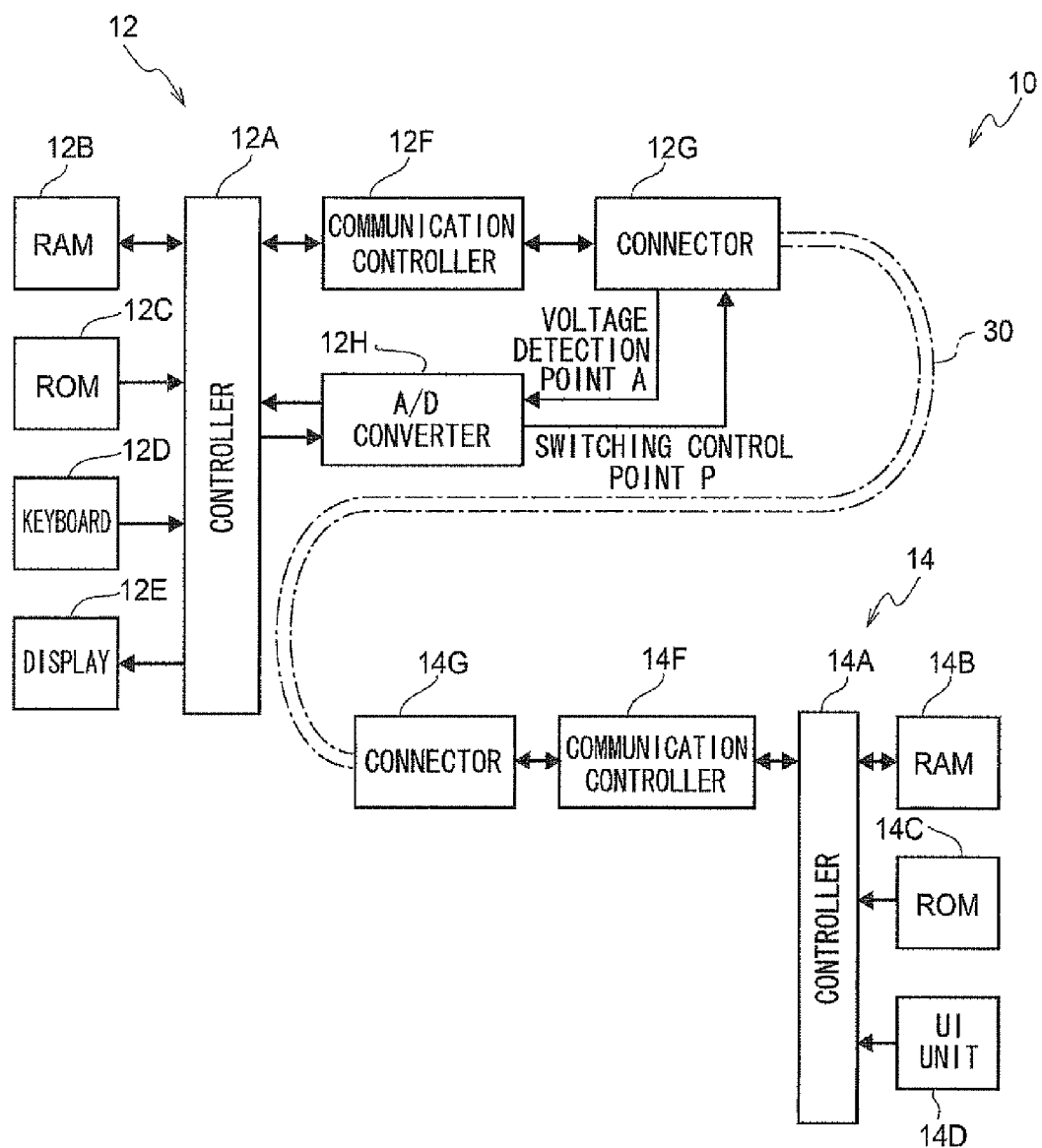
FIG. 14 is a block diagram showing an example of the essential structure of the electric system in an image forming system according to the third exemplary embodiment.

The overall structure of the image forming system 10 and the structures of the communication cable 30 and the connectors 12G and 14G according to a third exemplary embodiment are the same as those of the image forming system 10 according to the above described first exemplary embodiment (see FIGS. 1, 3, and 4), and therefore, explanation of them is omitted herein. Referring now to FIG. 13, the structures of the peripheral portions of the connector 12G and the connector 14G according to the third exemplary embodiment are described. In FIG. 13, the same components as those according to the second exemplary embodiment shown in FIG. 10 are denoted by the same reference numerals as those in FIG. 10, and explanation of them is omitted herein.

As shown in the drawing, the structure of the image forming system 10 according to the third exemplary embodiment greatly differs from the image forming system 10 according to the second exemplary embodiment in that a transistor 70 functioning as a switching component is provided between the resistor 50 and the pull-up power supply.

Specifically, the emitter and the collector of the transistor 70 are connected in series between the pull-up power supply and the resistor 50. Meanwhile, the base of the transistor 70 is connected as a switching control point P to the controller 12A via the A/D converter 12H, and the switching operation of the transistor 70 is controlled by the controller 12A.

Figure 15:
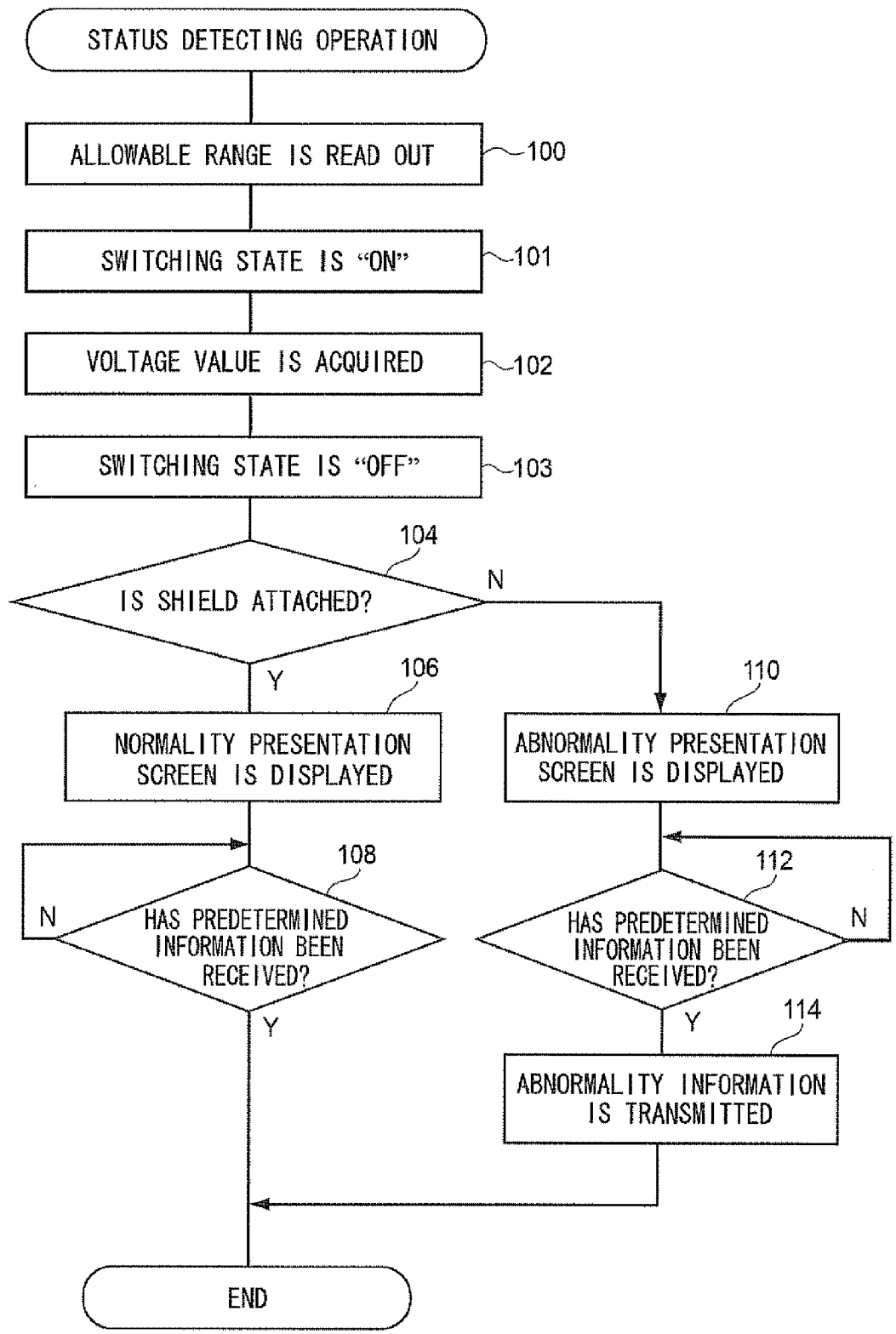
FIG. 15 is a flowchart showing an example of the operation flow in a status detecting operation program according to the third exemplary embodiment.

Referring now to FIG. 15, the operation to activate the status detecting function of the image forming system 10 according to this exemplary embodiment is described. FIG. 15 is a flowchart showing the procedures of a status detecting operation program according to the third exemplary embodiment. The status detecting operation program is to be executed by the controller 12A of the control device 12 when the instruction information for instructing the image forming system 10 to execute the status detecting function where the control device 12 and the image forming apparatus 14 are connected to each other by a communication cable is received from the user of the image forming system 10 via the keyboard 12D. The steps for carrying out the same procedures as those of the status detecting operation program according to the first exemplary embodiment shown in FIG. 6 are denoted by the same step numbers as those in FIG. 6, and explanation of them is omitted herein.

At step 101 of FIG. 15, control is performed so that the switching state of the transistor 70 becomes an on state (a connected state). At step 103, control is performed so that the switching state of the transistor 70 becomes an off state (a disconnected state).

In the image forming system 10 according to the third exemplary embodiment, a pull-up voltage is applied to the grounding member 42A of the connector 12G, only when the voltage value at the voltage detection point A is acquired. Accordingly, a trouble in a communication operation due to voltage application to the shielding member of the communication cable 30 is prevented.

Although a point between the resistor 50 and the grounding member 42A of the connector 12G is used as a voltage detection point in this exemplary embodiment, the invention is not limited to such arrangement. For example, a point indicated by a dot-and-dash line between the grounding member 42B of the connector 14G and the resistor 56 in FIG. 13 may be used.

In this case, the status detecting operation program may be executed by the image forming apparatus 14, or the voltage value at the voltage detection point D may be transmitted to the control device 12 via the communication cable 30 so that the status detecting operation program is executed by the control device 12, for example.

The location of the transistor 70 is not limited to a position between the pull-up power supply and the resistor 50, but may also be any position between the pull-up power supply on the side of the connector 12G and the grounding point on the side of the connector 14G where the communication cable 30 is connected to the connectors 12G and 14G, such as a position between the resistor 50 and the grounding member 42A of the connector 12Q or a position between the grounding member 42B of the connector 14G and the resistor 56. This exemplary embodiment may be applied to the image forming system 10 according to the first exemplary embodiment illustrated in FIG. 9. In such an example case, the transistor 70 may be located at least either in a position between the pull-up power supply of the connector 12G and the grounding point of the connector 12G, or in a position between the pull-up power supply of the connector 14G and the grounding point of the connector 14G.

Instead of the transistor 70, other switching elements such as a diode or a relay switch may be used.

Fourth Exemplary Embodiment

Figure 16:
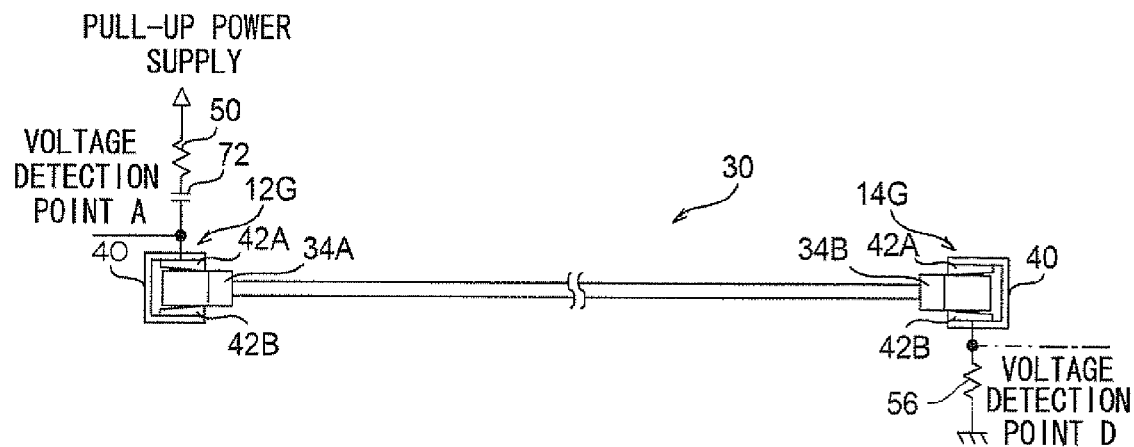
FIG. 16 is a plan view (partially a circuit diagram) showing example structures of the peripheral portions of connectors according to the fourth exemplary embodiment.

The overall structure of the image forming system 10 and the structures of the communication cable 30 and the connectors 12G and 14G according to a fourth exemplary embodiment are the same as those of the image forming system 10 according to the above described first exemplary embodiment (see FIGS. 1 through 4), and therefore, explanation of them is omitted herein. Referring now to FIG. 16, the structures of the peripheral portions of the connector 12G and the connector 14G according to the fourth exemplary embodiment are described. In FIG. 16, the same components as those according to the second exemplary embodiment shown in FIG. 10 are denoted by the same reference numerals as those in FIG. 10, and explanation of them is omitted herein.

As shown in the drawing, the structure of the image forming system 10 according to the fourth exemplary embodiment greatly differs from the image forming system 10 according to the second exemplary embodiment in that a capacitor 72 functioning as a storage component is provided between the resistor 50 and the grounding member 42A of the connector 12G.

In this case, current flows from the pull-up power supply only while the capacitor 72 is being charged. Accordingly, troubles in communication operations due to voltage application to the shielding member of the communication cable 30 can be restrained.

Figure 17:
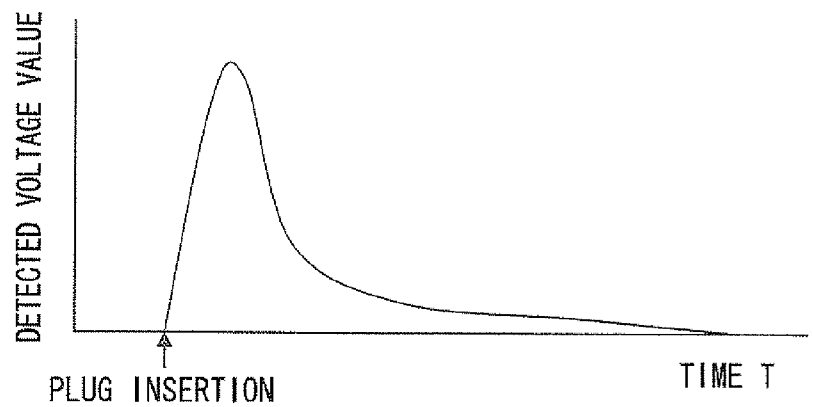
FIG. 17 is a graph showing an example of a variation in voltage at a voltage detection point A over time in the structure illustrated in FIG. 16.

In this case, the voltage at the voltage detection point A varies with the resistance value of the resistor 50, as shown as an example in FIG. 17. Accordingly, by searching for the variation, a check can be made to determine whether the connected communication cable has a shield.

Although a point between the resistor 50 and the grounding member 42A of the connector 12G is used as a voltage detection point in this exemplary embodiment, the invention is not limited to such arrangement. For example, a point indicated by a dot-and-dash line between the grounding member 42B of the connector 14G and the resistor 56 in FIG. 13 may be used.

In this case, the status detecting operation program may be executed by the image forming apparatus 14, or the voltage value at the voltage detection point D may be transmitted to the control device 12 via the communication cable 30 so that the status detecting operation program is executed by the control device 12, for example.

The location of the capacitor 72 is not limited to a position between the resistor 50 and the grounding member 42A of the connector 12G, but may also be any position between the pull-up power supply on the side of the connector 12G and the grounding point on the side of the connector 14G where the communication cable 30 is connected to the connectors 12G and 14G, such as a position between the pull-up power supply and the resistor 50, or a position between the grounding member 42B of the connector 14G and the resistor 56. This exemplary embodiment may be applied to the image forming system 10 according to the first exemplary embodiment illustrated in FIG. 9. In such an example case, the capacitor 72 may be located at least either in a position between the pull-up power supply of the connector 12G and the grounding point of the connector 12G, or in a position between the pull-up power supply of the connector 14G and the grounding point of the connector 14G.

In each of the above described exemplary embodiments, the information indicating the shielding state of the communication cable based on a result of detection of the voltage value at a voltage detection point is presented, and the detected voltage value is stored as history information. However, the invention is not limited to those operations, and another operation utilizing the detected voltage value or a combination of operations utilizing the detected voltage value may be performed as well as the above mentioned operations.

In each of the above described exemplary embodiments, a status detecting device of the invention is applied to an image forming system. However, the invention is not limited to that. For example, a status detecting device of the invention may be applied to other systems that performs communications between devices of some kind, such as a system that performs communications between computers, or a system that performs communications between a computer and an image reading apparatus.

In each of the above described exemplary embodiments, a LAN cable compatible with the Ethernet (a registered trade name) is used as the communication cable. However, the invention is not limited to this, and a cable that has plugs of the same model and is compliant with other communication standards that allow the existence of cables having shields and the existence of cables having no shields may be used.

The operation flow in the status detecting operation program described in each of the above exemplary embodiments is also merely an example. Therefore, unnecessary steps may be skipped, new steps may be added, and the process sequence may be changed without departing from the scope of the invention.

What is claimed is:

1. A method for detecting a status of a communication wire, comprising:
   providing a first contact member in a connection portion to which a connecting portion of the communication wire having the connecting portion at an end portion thereof is to be connected, the first contact member being brought into contact with a shielding member of the communication wire when the connecting portion is connected to the connection portion;
   providing a second contact member in the same connection portion in which the first contact member is provided, the second contact member is not electrically connected to the first contact member, the second contact member being brought into contact with the shielding member when the connecting portion is connected to the connection portion;
   applying a predetermined voltage to the first contact member;
   grounding the second contact member;
   detecting at least one of a potential between the applying component and the first contact member, or a potential between the second contact member and the grounding component; and
   executing predetermined processing, based on a detection result from the detecting component.

2. The method of claim 1, further comprising:
   performing a switching operation that causes (i) the applying component to apply a voltage to the first contact member when the detecting component detects a potential, and (ii) the applying component to not apply a voltage to the first contact member when the detecting component does not detect a potential.

3. The method of claim 1, further comprising:
   temporarily storing a voltage to be applied from the applying component to the first contact member.

4. A status detecting device comprising:
   a first contact member that is provided in a connection portion to which a connecting portion of a communication wire having the connecting portion at an end portion thereof is to be connected, the first contact member being brought into contact with a shielding member of the communication wire when the connecting portion is connected to the connection portion;
   a second contact member that is provided in the same connection portion in which the first contact member is provided and is not electrically connected to the first contact member, the second contact member being brought into contact with the shielding member when the connecting portion is connected to the connection portion;
   an applying component that applies a predetermined voltage to the first contact member;
   a grounding component that grounds the second contact member;
   a detecting component that detects at least one of a potential between the applying component and the first contact member, or a potential between the second contact member and the grounding component; and
   an executing component that executes predetermined processing based on a detection result from the detecting component.

5. The status detecting device of claim 4, further comprising:
   a switching component that performs a switching operation to cause the applying component to apply a voltage to the first contact member when the detecting component detects a potential, and to cause the applying component to not apply a voltage to the first contact member when the detecting component does not detect a potential.

6. The status detecting device of claim 4, further comprising:
   a storage component that temporarily stores a voltage to be applied from the applying component to the first contact member.

7. A non-transitory computer-readable medium storing a program causing a computer to execute a process for detecting a status of a communication wire with a status detecting device, the process comprising:
   detecting at least one of a potential between an applying component and a first contact member, or a potential between a second contact member and a grounding component; and
   executing predetermined processing, based on a detection result from the detecting step, wherein
   the first contact member is provided in a connection portion to which a connecting portion of the communication wire having the connecting portion at an end portion thereof is to be connected, the first contact member being brought into contact with a shielding member of the communication wire when the connecting portion is connected to the connection portion,
   the second contact member is provided in the same connection portion in which the first contact member is provided, the second contact member is not electrically connected to the first contact member, the second contact member being brought into contact with the shielding member when the connecting portion is connected to the connection portion, a predetermined voltage is applied to the first contact member, and the second contact member is grounded with the grounding component.

8. A status detecting device comprising:

a first contact member that is provided in a first connection portion to which one of connecting portions of a communication wire having the connecting portions at either end portions thereof is to be connected, the first contact member being brought into contact with a shielding member of the communication wire when the one of the connecting portions is connected to the first connection portion;

a second contact member that is provided in a second connection portion to which the other one of the connecting portions of the communication wire is to be connected, the second contact member being brought into contact with the shielding member when the other one of the connecting portions is connected to the second connection portion;

an applying component that applies a predetermined voltage to the first contact member;

a grounding component that grounds the second contact member;

a detecting component that detects (i) a potential between the applying component and the first contact member, and (ii) a potential between the second contact member and the grounding component; and an executing component that executes predetermined processing based on a detection result from the detecting component.

* * * * *